US007046050B1

(12) United States Patent
Schottler

(10) Patent No.: US 7,046,050 B1
(45) Date of Patent: *May 16, 2006

(54) HIGH SIDE NFET GATE DRIVING CIRCUIT

(75) Inventor: Joseph J. Schottler, Crystal, MN (US)

(73) Assignee: Sauer-Danfoss Inc., Ames, IA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/139,877

(22) Filed: May 27, 2005

Related U.S. Application Data

(63) Continuation of application No. 10/751,081, filed on Jan. 2, 2004, now Pat. No. 6,975,146.

(51) Int. Cl.
*H03K 3/00* (2006.01)
*H03K 17/687* (2006.01)

(52) U.S. Cl. ........................ 327/108; 327/427; 327/432

(58) Field of Classification Search ............... None
See application file for complete search history.

(56) References Cited

U.S. PATENT DOCUMENTS

| RE32,526 E | 10/1987 | Hochstein | 327/432 |
|---|---|---|---|
| 5,028,811 A * | 7/1991 | Le Roux et al. | 327/110 |
| 5,359,244 A * | 10/1994 | Hopkins | 327/434 |
| 5,371,418 A | 12/1994 | Leipold et al. | 327/109 |
| 5,672,992 A * | 9/1997 | Nadd | 327/390 |
| 5,767,562 A * | 6/1998 | Yamashita | 257/500 |
| 5,796,276 A * | 8/1998 | Phillips et al. | 327/108 |
| 5,952,740 A * | 9/1999 | Maeda et al. | 307/130 |
| 5,952,865 A * | 9/1999 | Rigazio | 327/333 |
| 6,169,431 B1 * | 1/2001 | Xu | 327/109 |
| 6,236,122 B1 | 5/2001 | Maeda et al. | 307/125 |
| 6,531,895 B1 | 3/2003 | Barrett et al. | 326/82 |
| 6,625,516 B1 | 9/2003 | Nimi et al. | 700/170 |
| 6,836,173 B1 * | 12/2004 | Yang | 327/390 |
| 2002/0145863 A1 | 10/2002 | Yamamoto | 363/59 |
| 2003/0111984 A1 | 6/2003 | Isham | 323/271 |
| 2003/0197543 A1 | 10/2003 | Imai | 327/427 |
| 2004/0130379 A1 | 7/2004 | Bolz et al. | 327/374 |

FOREIGN PATENT DOCUMENTS

DE 19918025 A1 11/2000

OTHER PUBLICATIONS

"Electronic Circuits Discrete and Integrated" by Schilling et al., pp. 45-51, 1989.
"Microelectronic Circuits" by Seda/Smith pp. 191-192, 1989.

\* cited by examiner

*Primary Examiner*—Tuan T. Lam

(57) ABSTRACT

A circuit that provides for a high side NFET gate driver that uses a circuit using only common capacitors, diodes, resistors, and transistors to create a high side NFET gate driver. The system is operated so that when there is a high input the NFET will turn off and when there is a low input the NFET will turn on.

6 Claims, 1 Drawing Sheet

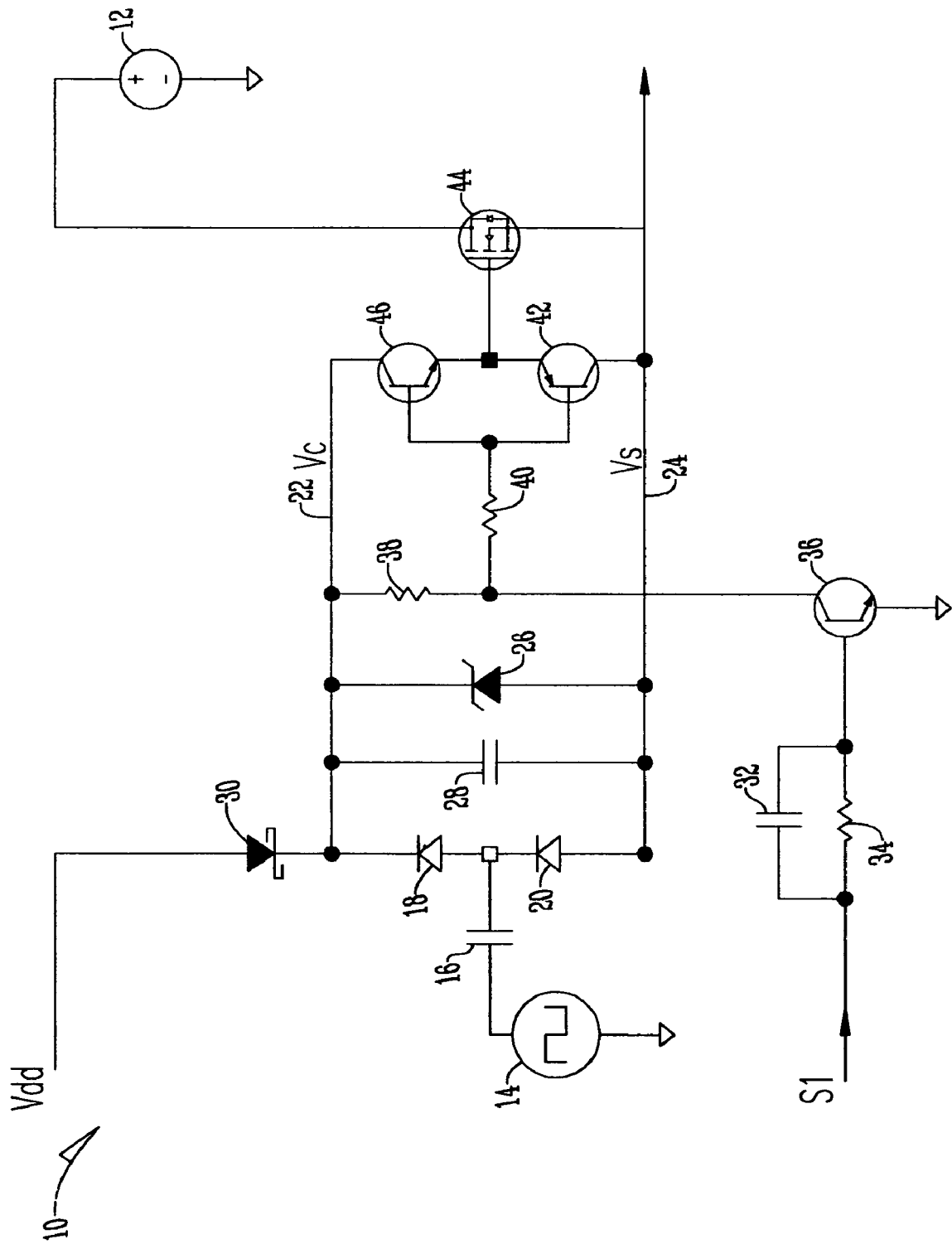

HIGH SIDE NFET GATE DRIVING CIRCUIT

This application is a continuation of application Ser. No. 10/751,081 filed Jan. 2, 2004, which issued as U.S. Pat. No. 6,975,146.

BACKGROUND OF THE INVENTION

MOSFETs (metal oxide semi conductor field effect transistors) are widely used as electrically controlled switches. N channel MOSFETs, or NFETs, are used more often than P channel MOSFETs, or PFETs, because they have inherently lower ON resistance. NFETs lower ON resistance is because of the higher mobility of electrons vs. holes. NFETs require a positive gate voltage to allow current to flow from drain to source ("turn the NFET on" or "close the switch").

A common switch application is one that switches power to a load, or closes a connection between a positive voltage source and a load sinking current to a lower potential, typically a ground. This is commonly referred to as a "high side" switch. If an NFET is to be used as a high side switch, the gate must be charged above the positive voltage source of the NFET sufficiently to turn on the NFET. This can be a difficult problem to solve as the most positive voltage in a system is commonly the supply voltage. Therefore, a method to control the gate of the NFET that is capable of driving the gate to a voltage above the positive voltage source must be used. This method must also be able to pull the gate voltage low enough to turn the NFET completely off. This requires a gate control circuit, which has two output states, 0V out and Vbat+Vgs where Vgs is the gate to source ON voltage and Vbat is the positive voltage source. Vgs is typically between 5 and 10V, but can be as high as 20V or as low as 1.8V.

Another common requirement of a switching device is to turn on and off rapidly. This could be to react to a fault condition where the opening or closing the switch would avert further damage. This high speed requirement could also be to achieve proportional control by means of Pulse Width Modulation (PWM). PWM is commonly achieved by pulsing the switch on and off, with the on time controlled with respect to the off time. In many applications the load to be powered requires proportional drive, or an amount of voltage somewhere between source voltage and ground. This creates an average voltage to the load between the source voltage and zero, or proportional control. By changing the on time with respect to the off time, the average voltage can be controlled.

The two requirements of driving the gate to a voltage above the source voltage and driving the source voltage rapidly commonly lead to an expensive solution. Therefore, there is a need in the art for a fast, low cost, high side NFET gate driver circuit that will improve upon the state of the art.

Thus, it is a primary object of the present invention to provide a method to control the gate of an NFET that is capable of driving the gate to a voltage above the positive voltage source in the circuit.

Another object of the present invention is to provide a high side NFET gate driver that can be manufactured at a low cost.

Yet another object of the present invention is to provide a fast, high side NFET gate driver.

A further object of the present invention is to provide a circuit that is able to hold the gate voltage low enough to turn off the NFET completely.

Another object of the present invention is to use the high side switch created in association with and drives the coil of an electrohydraulic valve.

These and other objects, features, or advantages of the present invention will become apparent from the specification and claims.

BRIEF SUMMARY OF THE INVENTION

The present invention is a circuit that is used to drive the gate of an N channel MOSFET to create a high side switch. When the circuit has a first or high input a first transistor will turn on, pulling the base of a second transistor low which in turn pulls the gate of a NFET turning the NFET off. When there is a second or low input into the circuit, the first transistor will turn off causing the second transistor to turn off. There upon a third transistor's gate will be pulled high via first and second resistors driving current into a local positive voltage passageway, thus driving the gate of the NFET to turn it on.

BRIEF DESCRIPTION OF THE DRAWINGS

The FIGURE is a schematic diagram of the circuit of the present invention.

DESCRIPTION OF THE PREFERRED EMBODIMENTS OF THE INVENTION

The circuit 10 of the present invention has a logic supply voltage $V_{dd}$ and a battery voltage 12 supplying voltage to the system. The circuit also has an input S1 and an oscillator 14 that is used to drive the charge pump circuit that is comprised of first capacitor 16 and first and second diodes 18 and 20 respectively, thus creating a local positive voltage ($V_c$) along the passageway 22. The local positive voltage of passageway 22 is clamped with respect to the passageway 24 having a source voltage ($V_s$) by the third diode 26 that is in parallel relation with first and second diodes 18 and 20. Also, in parallel relation with both first second and third diode 18, 20, and 26 is a second capacitor 28. Additionally, the logic supply voltage ($V_{dd}$) is electrically connected to a fourth diode 30. The input S1 is received by a third capacitor 32 that is in parallel with a first resistor 34 that is electrically connected to a first transistor 36. The first transistor 34 is electrically connected to a second resistor 38, a third resistor 40, and a second transistor 42. The second transistor 42 is electrically connected to an N channel MOSFET 44 and a third transistor 46.

In operation, circuit 10 consists of two passageways 22, 24. Within the local positive voltage passageway 22 is a charge pump circuit that creates the local voltage $V_c$. Also included along the passageway 22 is the second resistor 38 from which the local voltage $V_c$ pulls current, the third resistor 40, and the third transistor 46. Transistor 46 has a predetermined threshold value such that when a predetermined amount of current is provided by the second and third resistors 38 and 40 its gate is pulled high thus driving the NFET 44.

Within passageway 24 of the supply voltage $V_s$ is the third capacitor 32 in parallel with the first resistor 34. Also included along passageway 24 is a first transistor 36 that has a predetermined threshold value such that when a predetermined amount of current is provided by the input S1 the transistor 36 will turn ON. Further along passageway 24 is the second transistor 42 that has a gate that is pulled low when the first transistor 36 in ON causing the NFET 44 to turn OFF.

Additional features of the circuit 10 include the third diode 26 that is used to clamp the local voltage $V_c$ with respect to the source voltage $V_s$. A logic supply voltage is used via the fourth diode 30 to hold the local positive voltage $V_c$ up when the first transistor 36 is ON by pulling current out of the local positive voltage via the second resistor 38. Also, if NFET 44 is not continually switching as in a PWM application an oscillator 14 may be used to drive the charge pump circuit.

When the oscillator 14 is in use, it drives the charge pump circuit creating a local positive voltage $V_c$ along passageway 22. Thus, a first or high input signal S1 will turn transistor 36 ON pulling the base of the second transistor 46 low which in turn pulls the gate of the NFET 44 low thus turning the NFET 44 OFF. When a second or low input signal S1 is present first transistor 36 will be turned OFF which will then turn OFF second transistor 42. Hence, the base of the third transistor 46 will be pulled high via the second and third resistors 38 and 40, thus driving current into the gate of the NFET 44 to turn it ON. Meanwhile, the fourth diode 30 serves to hold the local positive voltage $V_c$ up while the input signal S1 is high thus pulling current out of the local positive voltage $V_c$ with the second resistor 38.

In a preferred embodiment the zener voltage of the diode 26 is typically 10 to 20 volts depending on the maximum gate to source or voltage allowed by the NFET 44. Also, if the NFET 44 is continuously switching, as in a PWM application, the oscillator 14 could be replaced with a short to ground and the switching of the NFET 44 would act as a charge pump for the local positive voltage $V_c$ found in passageway 22. Furthermore, in a preferred embodiment $V_{dd}$ would typically be between 5 and 15 volts. It should finally be noted that this circuit is not appropriate for all applications. For example, if the voltage from battery 12 is much higher than 60 volts, it might be difficult to find a transistor 36 with sufficient gain and voltage to function with the speed necessary to sufficiently run this circuit. Also in a preferred embodiment the NFET 44 is electrically associated with and drives the coil of an electrohydraulic valve.

Therefore, a fast, low cost, high side, NFET gate drive has been disclosed. The gate driver provides for a method to control the gate of an NFET 44, which is capable of driving the gate to a voltage above that of the battery 12. This circuit is also able to pull the gate voltage low enough to turn the NFET completely off. This entire circuit additionally is made of components that are common parts and very low cost thus providing a very inexpensive high side NFET. Thus, all of the objects of the present invention have been achieved.

It will be appreciated by those skilled in the art that other various modifications could be made to the device without the parting from the spirit in scope of this invention. All such modifications and changes fall within the scope of the claims and are intended to be covered thereby.

What is claimed is:

1. An electrical circuit having an input signal for driving the gate of an NFET with a base to create a high side switch comprising:
    a source voltage passageway adapted to receive the input signal and electrically connected to the NFET;
    a local positive voltage passageway electrically connected to the NFET;
    a power source electrically connected to the NFET providing a positive voltage source to the NFET;
    a diode electrically connected between the source voltage passageway and the local positive voltage passageway to clamp the local voltage passageway with respect to the source voltage passageway;
    wherein the source voltage passageway consists of a first transistor having a threshold voltage and adapted to receive the input signal; and a second transistor electrically connected to the first transistor such that when the threshold voltage of the first transistor is not supplied the second transistor will deactivate; said second transistor being electrically connected to the base of the NFET.

2. An electrical circuit having an input signal for driving the gate of an NFET with a base to create a high side switch comprising:
    a source voltage passageway adapted to receive the input signal and electrically connected to the NFET;
    a local positive voltage passageway electrically connected to the NFET;
    a power source electrically connected to the NFET providing a positive voltage source to the NFET; wherein the source voltage passageway consists of a first transistor having a threshold voltage and adapted to receive the input signal; and a second transistor electrically connected to the first transistor such that when the threshold voltage of the first transistor is not supplied the second transistor will deactivate; said second transistor being electrically connected to the base of the NFET; and
    wherein the local positive voltage passageway consists of a charge pump circuit having a first and second diode in parallel relation with a capacitor and adapted to create a local positive voltage; a third diode in parallel relation to the capacitor; a first resistor and a second resistor electrically connected to the charge pump circuit; and a third transistor electrically connected to the charge circuit such that the first and second resistors drive current into the gate of the NFET when the threshold voltage of the first transistor is not supplied.

3. The electrical circuit of claim 2 further comprising a logic supply voltage operably connected to a fourth diode that is electrically connected to the charge pump circuit and adapted to hold the local positive voltage up when pulling current out of the second resistor.

4. The electrical circuit of claim 2 wherein the charge pump circuit is driven by an oscillator.

5. The electrical circuit of claim 2 wherein the NFET continuously switches.

6. An electrical circuit having an input signal for driving a gate of an NFET with a base to create a high side switch comprising:
    a source voltage passageway adapted to receive the input signal and electrically connected to the NFET;
    a local positive voltage passageway electrically connected to the NFET;
    a power source electrically connected to the NFET providing a positive voltage source to the NFET;
    wherein the source voltage passageway comprises a first transistor having a threshold voltage and adapted to receive the input signal; and
    wherein the local positive voltage passageway comprises a charge pump circuit; a first and second resistor electrically connected to the charge pump circuit; and a second transistor electrically connected to the charge pump circuit such that the first and second resistors drive current into the gate of the NFET when the threshold voltage of the first transistor is not supplied.

* * * * *